(12) United States Patent
Murali

(10) Patent No.: US 6,219,910 B1
(45) Date of Patent: Apr. 24, 2001

(54) METHOD FOR CUTTING INTEGRATED CIRCUIT DIES FROM A WAFER WHICH CONTAINS A PLURALITY OF SOLDER BUMPS

(75) Inventor: Venkatesan Murali, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/263,118

(22) Filed: Mar. 5, 1999

(51) Int. Cl.[7] ........................................ H05K 3/34
(52) U.S. Cl. .............................. 29/840; 29/740; 228/179; 228/180.21; 228/180.22
(58) Field of Search .................... 29/840, 740; 228/179, 228/180.21, 180.22

(56) References Cited

U.S. PATENT DOCUMENTS

| | | |
|---|---|---|
| 4,921,157 | * 5/1990 | Dishon et al. . |
| 4,937,006 | * 6/1990 | Bickford et al. . |
| 5,615,825 | * 4/1997 | Bobbio et al. . |
| 5,844,304 | * 12/1998 | Kata et al. . |
| 5,989,982 | * 11/1999 | Yoshikaza . |
| 6,013,381 | * 1/2000 | Bobbio et al. . |

* cited by examiner

*Primary Examiner*—Carl J. Arbes
(74) *Attorney, Agent, or Firm*—Blakely, Sokoloff, Taylor & Zafman LLP

(57) ABSTRACT

A method for cutting an integrated circuit die from a wafer. The method may include the step of forming a solder bump on an integrated circuit wafer. The solder bump is then oxidized. The oxidization process may form an outer oxidized layer on the solder bump. An integrated circuit die is cut from the wafer after the oxidization step. The cutting process may include spraying a fluid onto the wafer. The oxidized solder may form a protective layer which reduces the amount of particles and lead hydroxide formed during the cutting process. The integrated circuit die may be mounted to a package substrate by reflowing the solder bump onto a pad of the substrate. The outer oxidized layer may be removed with a flux that is used to reflow the solder bump onto the substrate.

18 Claims, 1 Drawing Sheet

METHOD FOR CUTTING INTEGRATED CIRCUIT DIES FROM A WAFER WHICH CONTAINS A PLURALITY OF SOLDER BUMPS

BACKGROUND OF THE INVENTION

1. Field of the Invention

The present invention relates to a method for forming solder bumps on an integrated circuit die.

2. Background Information

Integrated circuits are typically assembled into a package that is mounted to a printed circuit board. There are various types of integrated circuit packages, including quad flat pack (QFP), organic pin grid array (OLGA), ball grid array (BGA) and controlled collapsed chip connection (C4) packages. C4 packages include a plurality of solder bumps that are attached to an integrated circuit die. The solder bumps are placed onto a package substrate and reflowed to attach the integrated circuit to the substrate.

The solder bumps are typically formed onto the integrated circuit when the circuit is part of a wafer. After solder bump formation the wafer is cut into a plurality of individual dies. Each die is then subsequently mounted to a substrate.

The wafer may be cut by a saw. A stream of highly pressurized water is typically directed at the cut location to cool and lubricate the saw. It has been found that the pressurized water may remove particles of solder from the solder joints during the wafer sawing process. The particles may create electrical shorts when the die is subsequently soldered to the substrate. Additionally, the water may form lead hydroxide on the solder bumps. The lead hydroxide may reduce the integrity of the resultant solder joints formed during the subsequent reflow process of the solder bumps. It would be desirable provide a process which would reduce the amount of contaminants and lead hydroxide formed during the wafer cutting process of a "C4" wafer.

SUMMARY OF THE INVENTION

One embodiment of the present invention is a method for cutting an integrated circuit die from a wafer. The method may include the step of forming a solder bump on an integrated circuit wafer. The solder bump is then oxidized. An integrated circuit die is cut from the wafer after the oxidization step.

DETAILED DESCRIPTION OF THE INVENTION

One embodiment of the present invention is a method for cutting an integrated circuit die from a wafer. The method may include the step of forming a solder bump on an integrated circuit wafer. The solder bump is then oxidized. The oxidization process may form an outer oxidized layer on the. solder bump. An integrated circuit die is cut from the wafer after the oxidization step. The cutting process may include spraying a fluid onto the wafer. The oxidized solder may form a protective layer which reduces the amount of particles and lead hydroxide formed during the cutting process. The integrated circuit die may be mounted to a package substrate by reflowing the solder bump onto a pad of the substrate. The outer oxidized layer may be removed with a flux that is used to reflow the solder bump onto the substrate.

Figure 1:
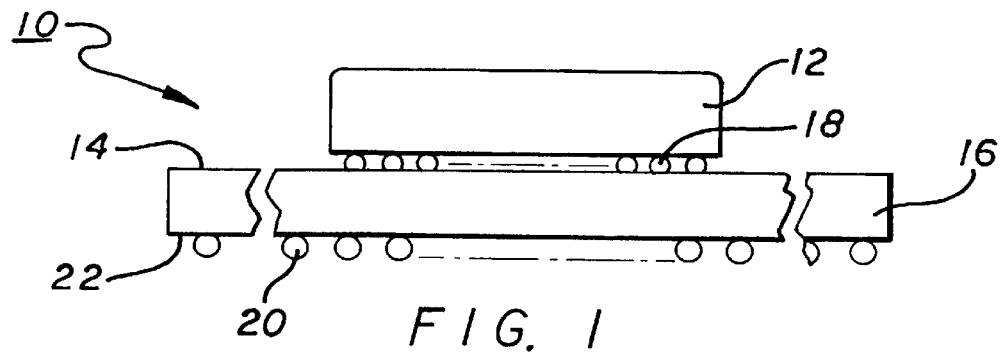
FIG. 1 is a perspective view of an embodiment of an integrated circuit package assembled from a method of the present invention.

Referring to the drawings more particularly by reference numbers, FIG. 1 shows an embodiment of an integrated circuit package 10 assembled with a method of the present invention. The package 10 may include an integrated circuit die 12 that is attached to a first surface 14 of a substrate 16. The integrated circuit die 12 may be attached to the substrate 16 by a plurality of solder joints 18. The solder joints 18 may be formed by reflowing solder bumps formed onto pads (not shown) of the die 12.

The package 10 may include a plurality of solder balls 20 that are attached to a second surface 22 of the substrate 16. The solder balls 20 are typically reflowed to attach the package 10 to a printed circuit board (not shown). The substrate 16 may include solder pads, routing traces, power/ground planes, vias, etc. that connect the solder joints 18 on the first surface 12 to the solder balls 20 on the second surface 22. The integrated circuit die 12 may be enclosed with a protective encapsulant (not shown). The integrated circuit package 10 shown is typically referred to as a "flip chip" or "C4" package.

Figure 2:
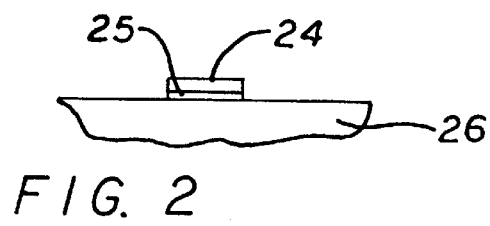
FIG. 2 is an illustration of a process wherein solder is applied to a wafer.

FIGS. 2–6 show a method for assembling the package 10. As shown in FIG. 2, solder material 24 may be applied to a die pad 25 of an integrated circuit wafer 26. The solder material 24 may be applied in the form of paste or individual solder balls. Although one die pad 25 is shown, it is to be understood that the integrated circuit 12 may have many pads 25 which are each covered with solder 26.

Figure 3:
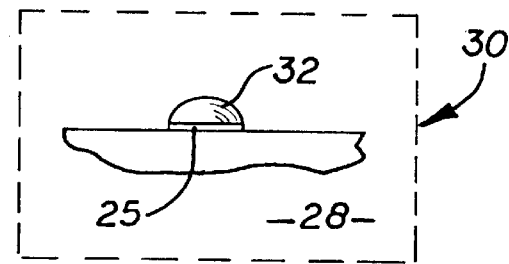
FIG. 3 is an illustration of the solder being reflowed into a solder bump.
Figure 4:
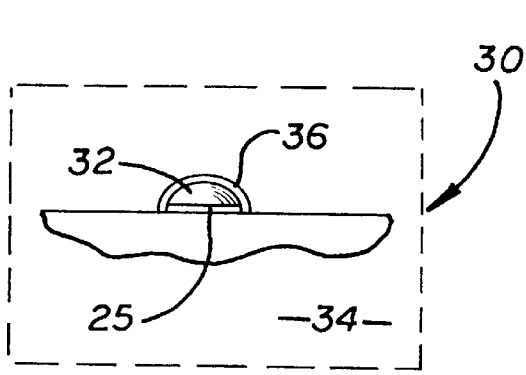
FIG. 4 is an illustration of the solder bump being oxidized.

As shown in FIG. 3, the wafer 26 may be placed in a first chamber 28 of an oven 30 which reflows the solder 24 into a solder bump 32 and forms an outer oxidized layer at the same station of the oven 30. The first chamber 28 is typically filled with hydrogen and may be elevated to a temperature of 400° C. As shown in FIG. 4, the wafer 26 may then be transferred to a second chamber 34 where an outer oxidized layer 36 is formed on the solder bump 32 during the formation of the bump. The second chamber 34 may contain oxygen ($O_2$) which promotes oxidization of the solder 24. The second chamber 34 may be at a lower temperature than the first chamber 28 so that the outer oxidized layer solidifies.

Figure 5:
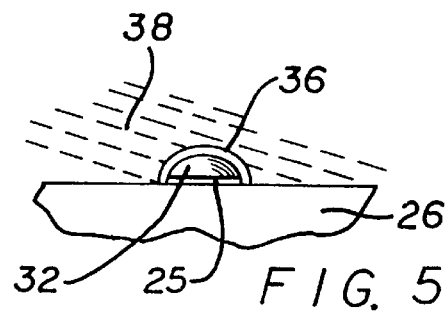
FIG. 5 is an illustration of a fluid being sprayed onto the solder bump during a cutting process of the wafer.

After formation of the solder bumps 32 the wafer 26 is cut into individual integrated circuit dies 12. As shown in FIG. 5, a stream of water 38 may be directed onto the wafer 26 during the cutting process. It is believed that the outer oxidized layer of the solder bumps 32 may reduce the amount of particles created by the pressurized stream of water. Additionally, it is believed that the outer oxidized layer also inhibits the formation of lead hydroxide by the water. The oxidized solder may therefore provide a protective layer during the cutting process of the wafer 26.

Figure 6:
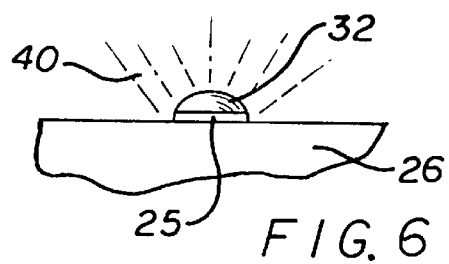
FIG. 6 is a side view showing solder flux being applied to the solder bumps.

As shown in FIG. 6, a solder flux 40 may be applied to the solder bumps 32 before the integrated circuit die 12 is soldered to a substrate. The flux 40 removes the outer oxidized layer from the solder bumps 32.

Figure 7:
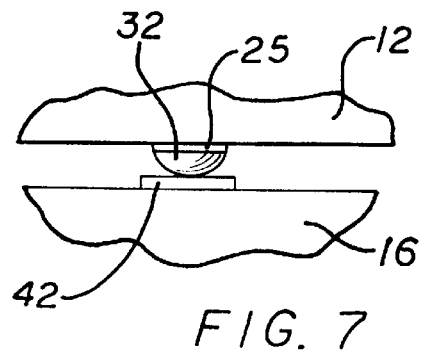
FIG. 7 is a side view showing an integrated circuit die being attached to a substrate.

As shown in FIG. 7, the solder bumps 32 are placed onto corresponding conductive pads 42 of the substrate 16. The solder bumps 32 are then reflowed to form the solder joints 18 which attach the integrated circuit die 12 to the substrate 16. A de-flux (not shown) can be applied to remove the solder flux and the oxidized metal from the substrate 16 and the area surrounding the solder joints 18. The solder balls 20 and encapsulant can then be attached in subsequent processes to complete the package 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for cutting an integrated circuit die from a wafer, comprising:
    a) forming a solder bump on an integrated circuit wafer;
    b) promoting oxidation of said solder bump to form a protective layer for said solder bump; and,
    c) cutting an integrated circuit die from said wafer, wherein said protective layer reduces particle creation from said solder bump during cutting of said integrated circuit die.

2. The method as recited in claim 1, wherein said solder bump is attached to said integrated circuit wafer by reflowing a solder.

3. The method as recited in claim 2, wherein the oxidation of said solder bump is promoted by supplying oxygen to said solder bump during said reflow of said solder.

4. The method as recited in claim 3, wherein the oxidation of said solder bump is promoted at a temperature that is lower than a reflow temperature of said solder bump.

5. The method as recited in claim 1, wherein said protective layer reduces particle creation when a stream of fluid is sprayed onto said integrated circuit wafer during step (c).

6. A method for assembling an integrated circuit package, comprising:
    a) forming a solder bump on an integrated circuit wafer so that the oxidation of an outer layer of said solder bump is promoted to form a protective layer for said solder bump;
    b) cutting an integrated circuit die from said integrated circuit wafer, wherein said protective layer reduces particle creation from said solder bump during cutting of said integrated circuit die;
    c) removing said outer oxidized layer from said solder bump;
    d) placing said solder bump onto a substrate; and,
    e) reflowing said solder bump to attach said integrated circuit die to said substrate.

7. The method as recited in claim 6, wherein said protective layer reduces particle creation when a stream of fluid is sprayed onto said integrated circuit wafer during step (c).

8. The method as recited in claim 7, wherein the oxidation of said outer layer is promoted by supplying oxygen to said solder bump during said reflow of said solder.

9. The method as recited in claim 8, wherein the oxidation of said outer layer is promoted at a temperature that is lower than a reflow temperature of said solder.

10. The method as recited in claim 6, wherein said outer is removed with a solder flux.

11. The method as recited in claim 10, wherein said solder flux and said outer layer are removed with a solder de-flux.

12. A method comprising:
    a) providing an IC wafer including a solder bump; and,
    b) promoting the oxidation of the solder bump to form a protective layer.

13. The method as recited in claim 12, wherein the promotion of oxidation occurs at a temperature that is lower than a reflow temperature of said solder bump.

14. The method as recited in claim 12, further comprising:
    removing organic residue from the surface of said solder bump.

15. The method as recited in claim 14, further comprising:
    using a flux to remove said organic residue.

16. The method as recited in claim 12, further comprising:
    removing the oxidation from said solder bump after promoting the oxidation of the solder bump.

17. A method comprising:
    a) providing an IC wafer including a solder bump; and,
    b) promoting the oxidation of the outer layer of a solder bump to form a protective layer for said solder bump.

18. The method as recited in claim 17, wherein said promotion of oxidation occurs at a temperature that is lower than a reflow temperature of said solder bump.

* * * * *